(12) United States Patent
Yu et al.

(10) Patent No.: US 9,401,337 B2
(45) Date of Patent: Jul. 26, 2016

(54) MOLDING STRUCTURE FOR WAFER LEVEL PACKAGE

(71) Applicant: Taiwan Semiconductor Manufacturing Company, Ltd., Hsin-Chu (TW)

(72) Inventors: Chen-Hua Yu, Hsin-Chu (TW); Chung-Shi Liu, Hsin-Chu (TW); Chih-Fan Huang, Kaoshung (TW); Chih-Wei Lin, Xinfeng Township (TW); Wei-Hung Lin, Xinfeng Township (TW); Ming-Da Cheng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 118 days.

(21) Appl. No.: 14/222,423

(22) Filed: Mar. 21, 2014

(65) Prior Publication Data

US 2015/0170937 A1    Jun. 18, 2015

Related U.S. Application Data

(60) Provisional application No. 61/917,827, filed on Dec. 18, 2013.

(51) Int. Cl.
*H01L 21/00* (2006.01)
*H01L 23/00* (2006.01)
*H01L 23/31* (2006.01)
*H01L 21/56* (2006.01)

(52) U.S. Cl.
CPC ............ *H01L 24/17* (2013.01); *H01L 23/3128* (2013.01); *H01L 24/19* (2013.01); *H01L 24/97* (2013.01); *H01L 21/561* (2013.01); *H01L 24/73* (2013.01); *H01L 2224/32225* (2013.01); *H01L 2224/48095* (2013.01); *H01L 2224/48227* (2013.01); *H01L 2224/73265* (2013.01); *H01L 2224/97* (2013.01); *H01L 2924/15311* (2013.01); *H01L 2924/181* (2013.01)

(58) Field of Classification Search
CPC ................................. H01L 29/00; H01L 21/00
USPC .............................. 257/738, 787; 438/50, 107
See application file for complete search history.

(56) References Cited

U.S. PATENT DOCUMENTS

| 5,652,436 | A  | * | 7/1997 | Stoner et al. | ........ H01L 21/2007 257/416 |
| 7,351,321 | B2 | * | 4/2008 | Cohen | ................. B81C 1/00126 205/118 |
| 9,082,881 | B1 | * | 7/2015 | Hackler, Sr. | ............ H01L 21/84 |
| 2014/0084482 | A1 | * | 3/2014 | Hu | ........................... H01L 24/06 257/774 |

\* cited by examiner

*Primary Examiner* — Jami M Valentine
(74) *Attorney, Agent, or Firm* — Slater Matsil, LLP

(57) ABSTRACT

Apparatus, and methods of manufacture thereof, in which a molding compound is formed between spaced apart microelectronic devices. The molding compound comprises micro-filler elements. No boundary of any of the micro-filler elements is substantially parallel to a substantially planar surface of the molding compound, or to a substantially planar surface of any of the microelectronic devices.

20 Claims, 8 Drawing Sheets

US 9,401,337 B2

1

MOLDING STRUCTURE FOR WAFER LEVEL PACKAGE

PRIORITY CLAIM AND CROSS-REFERENCE

This application claims the benefit of the U.S. Provisional Application No. 61/917,827, entitled "Molding Structure For Wafer Level Package," filed Dec. 18, 2013, the entire disclosure of which is hereby incorporated herein by reference.

BACKGROUND

For wafer-level, exposed-molding packaging, molding residue on a chip may cause redistribution layer (RDL) delamination defects and failures. For example, oxidation of device contacts during processing may cause delamination and perhaps open-fails on the RDL layer. Other issues that may present challenges to device function are the use of grinding and other mechanical means for removing materials. Such practices may add to manufacturing costs and/or negatively affect components, such as with overgrinding and material residue. Device reliability can also be compromised by uncontrolled recesses between a die and molding compound thereon, as well as when the RDL simultaneously contacts too many different materials.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

2

Figure 13:
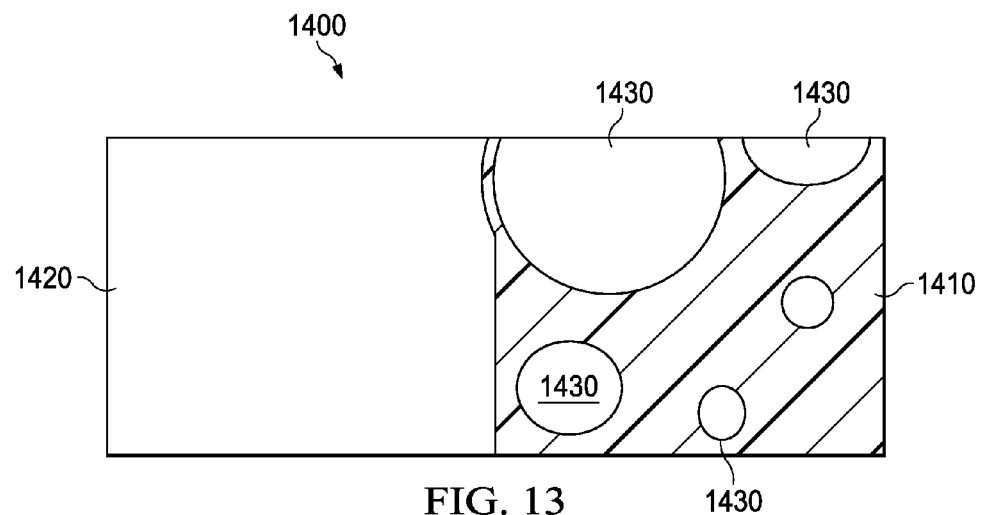

FIG. 13 is a schematic view of a portion of prior art apparatus.

Figure 11:
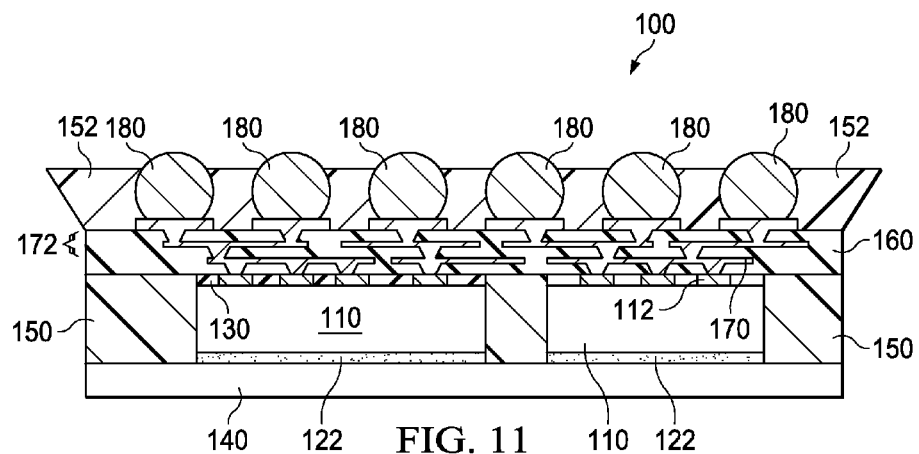
FIG. 11 is a schematic view of the apparatus shown in FIG. 10 in a subsequent stage of manufacture in accordance with some embodiments.
Figure 12:
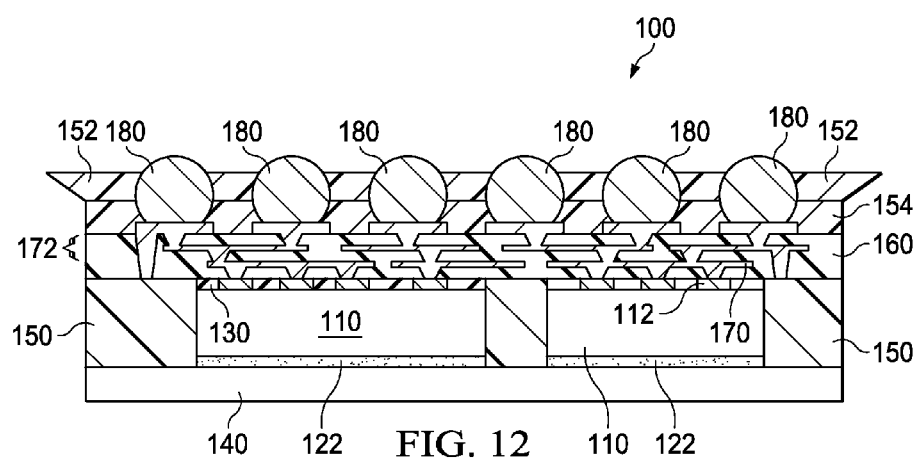
FIG. 12 is a schematic view of another embodiment of the apparatus shown in FIG. 11.
Figure 14:
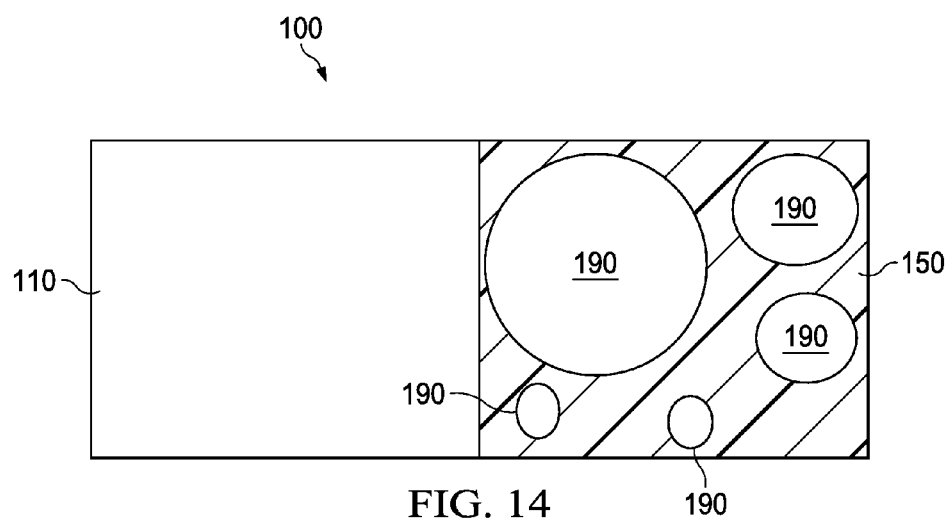

FIG. 14 is a schematic view of a portion of the apparatus shown in FIG. 11 or 12 in accordance with some embodiments.

Figure 15:
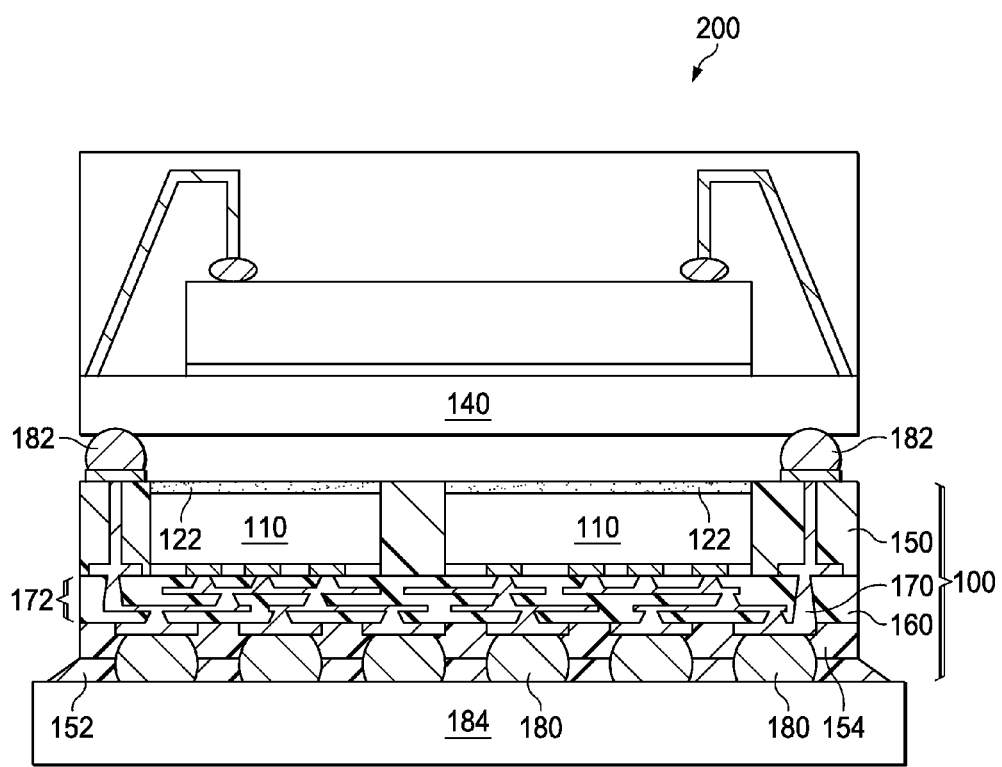

FIG. 15 is a schematic view of the apparatus shown in FIG. 12 in a subsequent stage of manufacture in accordance with some embodiments.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
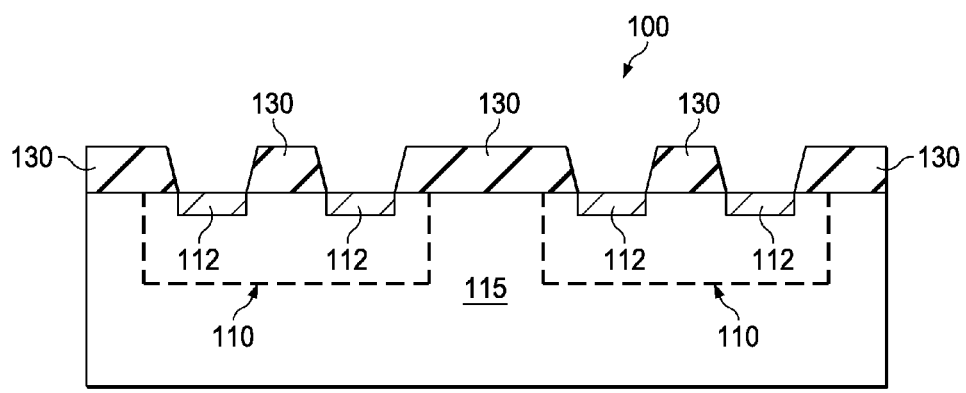
FIG. 1 is a schematic view of at least a portion of apparatus in accordance with some embodiments.

FIG. 1 is a sectional view of at least a portion of an apparatus 100 in an intermediate stage of manufacture according to one or more aspects of the present disclosure. The apparatus 100 comprises a plurality of microelectronic devices 110 formed in and/or on a substrate 115. The apparatus 100 may further comprise a first dielectric layer 130 over portions of the microelectronic devices 110.

For example, the first dielectric layer 130 may have openings exposing one or more electrical contacts 112 of one or more of the microelectronic devices 110. The electrical contacts 112 may comprise copper, aluminum, doped polysilicon, and/or other materials. The first dielectric layer 130 may comprise PBO (polybenzoxazole) and/or other dielectric materials, and may have a thickness ranging between about one micron and about twenty microns. However, other thicknesses are also within the scope of the present disclosure. The first dielectric layer 130 may be deposited on the substrate 115 by chemical-vapor deposition (CVD), plasma-enhanced CVD (PECVD), metal organic CVD (MOCVD), and/or other processes, and subsequently patterned by one or more photolithography processes. One or more chemical-mechanical planarizing (CMP), grinding, polishing, and/or other mechanical material removal processes may also be utilized during the formation of the patterned first dielectric layer 130 depicted in FIG. 1.

Figure 2:
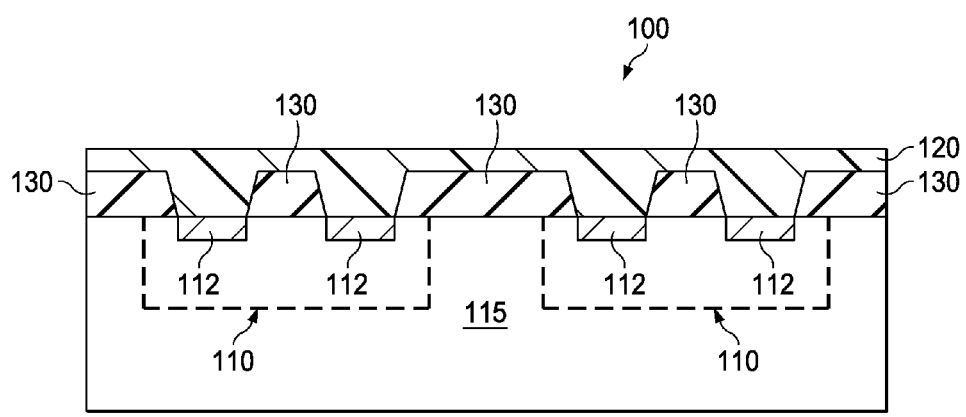
FIG. 2 is a schematic view of the apparatus shown in FIG. 1 in a subsequent stage of manufacture in accordance with some embodiments.

FIG. 2 is a sectional view of the apparatus 100 shown in FIG. 1 in a subsequent stage of manufacture according to one or more aspects of the present disclosure. In FIG. 2, a sacrificial layer 120 has been deposited over the first dielectric layer 130. Such deposition may include forming portions of the sacrificial layer 120 in the openings in the first dielectric layer on the electrical contacts 112. The sacrificial layer 120 may protect the electrical contacts 112 from oxidation, and may comprise one or more organic polymers and/or other materials. The sacrificial layer 120 may be deposited by one or more CVD processes, spin-on coating, and/or other processes, perhaps to a thickness ranging between about one microns and about ten microns over the first dielectric layer 130.

Figure 3:
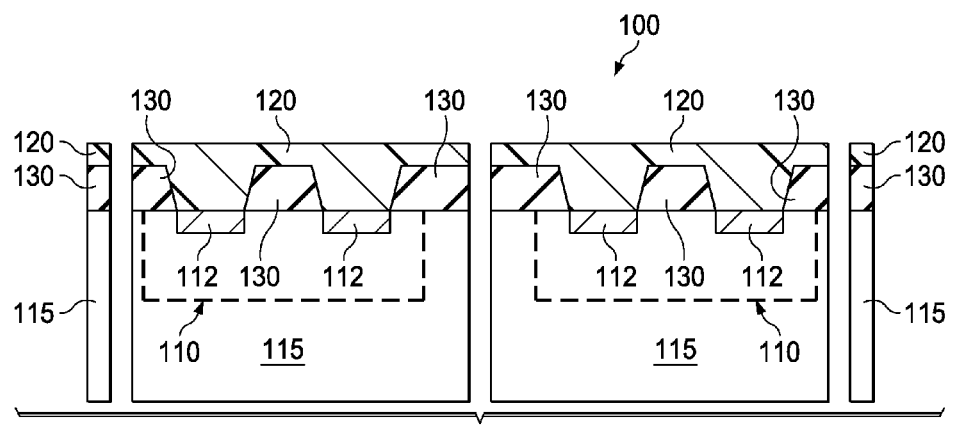
FIG. 3 is a schematic view of the apparatus shown in FIG. 2 in a subsequent stage of manufacture in accordance with some embodiments.

FIG. 3 is a sectional view of the apparatus 100 shown in FIG. 2 in a subsequent stage of manufacture according to one or more aspects of the present disclosure. In FIG. 3, the microelectronic devices 110 have been separated. Separating the microelectronic devices may utilize grinding, dicing, laser cutting, sawing, and/or other processes to physically separate the microelectronic devices 110 from each other.

Figure 4:
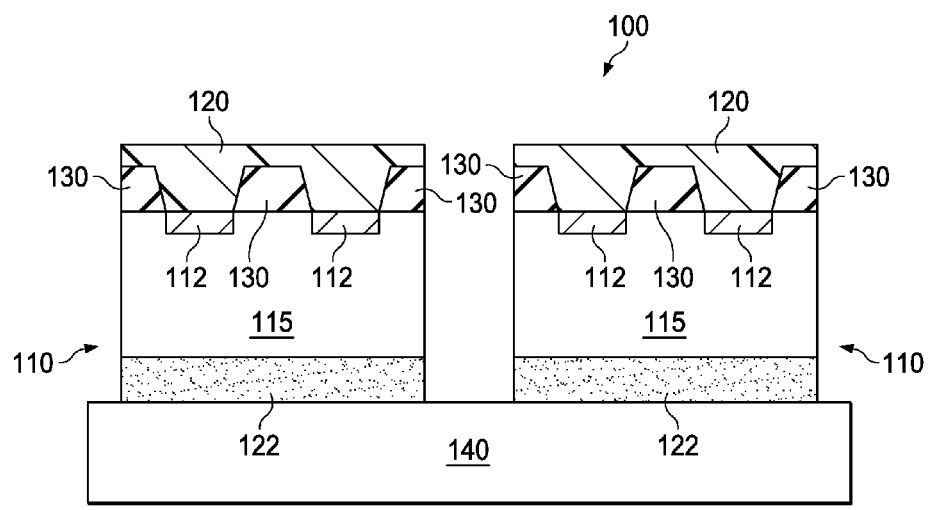
FIG. 4 is a schematic view of the apparatus shown in FIG. 3 in a subsequent stage of manufacture in accordance with some embodiments.

FIG. 4 is a sectional view of the apparatus 100 shown in FIG. 3 in a subsequent stage of manufacture according to one or more aspects of the present disclosure. In FIG. 4, the separated microelectronic devices 110 have been coupled to a substrate 140. The microelectronic devices 110 may be coupled to the substrate 140 via one or more adhesive layers 122, although other embodiments are also within the scope of the present disclosure. The one or more adhesive layers 122 may comprise glue, polymer adhesive, and/or other materials. The substrate 140 may comprise a wafer, a carrier, a printed circuit board (PCB), and/or other types of substrates and/or devices. In other implementations, the substrate 140 may comprise or replaced with many different types of substrates, packages, and/or package-on-package (PoP) assemblies.

Figure 5:
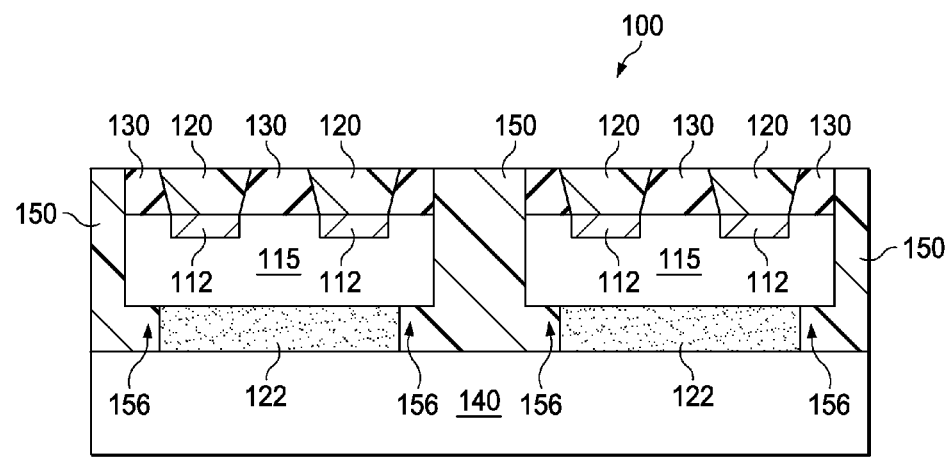
FIG. 5 is a schematic view of the apparatus shown in FIG. 4 in a subsequent stage of manufacture in accordance with some embodiments.

FIG. 5 is a sectional view of the apparatus 100 shown in FIG. 4 in a subsequent stage of manufacture according to one or more aspects of the present disclosure. In FIG. 5, a molding compound 150 has been deposited over the substrate 140. The molding compound 150 surrounds the separated microelectronic devices 110, although upper surfaces of the sacrificial layer 120 may remain uncovered. The molding compound 150 may be injected into areas between the microelectronic devices 110 and the substrate 140, perhaps via one or more injection molding and/or transfer molding processes. For example, one such molding process may involve placing the apparatus 100 within a molding chase (not shown), closing the molding chase, and injecting the molding compound 150 into a molding cavity defined around the apparatus 100 by the molding chase. Heat and/or a vacuum may be applied to the molding cavity to assist the flow and/or hardening of the molding compound 150.

One or more CMP and/or other mechanical material removal processes may also be subsequently employed, such as to remove excess molding compound 150 and/or expose upper surfaces of the sacrificial layer 120. Such processing may also include removing a sufficient portion of the sacrificial layer 120 to expose the upper surfaces of the first dielectric layer 130, such that upper surfaces of the sacrificial layer 120, the upper surfaces of the first dielectric layer 130, and the upper surfaces of the molding compound 150 may be substantially flush relative to each other. Alternatively, the portion of the sacrificial layer 120 overlying the first dielectric layer 130 may be removed by CMP and/or other mechanical material removal processes before the molding process, such that the upper surfaces of the molding compound 150 are initially formed substantially flush with the upper surfaces of the sacrificial layer 120 and/or the upper surfaces of the first dielectric layer 130.

As also illustrated in FIG. 5, the molding compound 150 may substantially fill spaces between the ones of the microelectronic devices 110 and the substrate 140. Thus, forming the molding compound 150 around the microelectronic devices 110 may include forming molded underfill structures 156.

Figure 6:
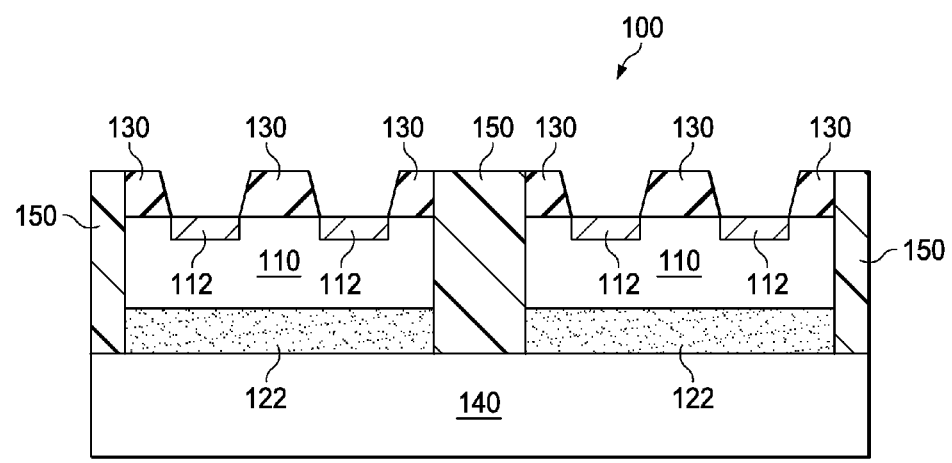
FIG. 6 is a schematic view of the apparatus shown in FIG. 5 in a subsequent stage of manufacture in accordance with some embodiments.

FIG. 6 is a sectional view of the apparatus 100 shown in FIG. 5 in a subsequent stage of manufacture according to one or more aspects of the present disclosure. In FIG. 6, at least a portion of the sacrificial layer 120 has been removed. Removing the sacrificial layer 120 may utilize one or more etchants, organic solvents, and/or other materials that may remove the sacrificial layer 120 without removing any of the first dielectric layer 130, the molding compound 150, or the microelectronic devices 110. The one or more processes utilized to remove the sacrificial layer may also remove any residue that may still be remaining on the first dielectric layer 130 from the formation of the molding compound 150. The extent to which the sacrificial layer 120 is removed may be that which is sufficient to expose at least a portion of each of the electrical contacts 112 of the microelectronic devices 110 within the openings in the first dielectric layer 130. However, the sacrificial layer 120 may also be completely removed.

Removing at least a portion of the sacrificial layer 120 may also expose upper surfaces of the first dielectric layer 130, if they were not already exposed by, for example, one or more CMP and/or other mechanical material removal processes that may have been utilized to remove excess portions of the molding compound 150. Removing at least a portion of the sacrificial layer 120 may also leave upper surfaces of one or more of the microelectronic devices (such as the electrical contacts 112) recessed below the upper surfaces of the molding compound 150. Such recessing may be to a varying depth within the scope of the present disclosure.

Figure 7:
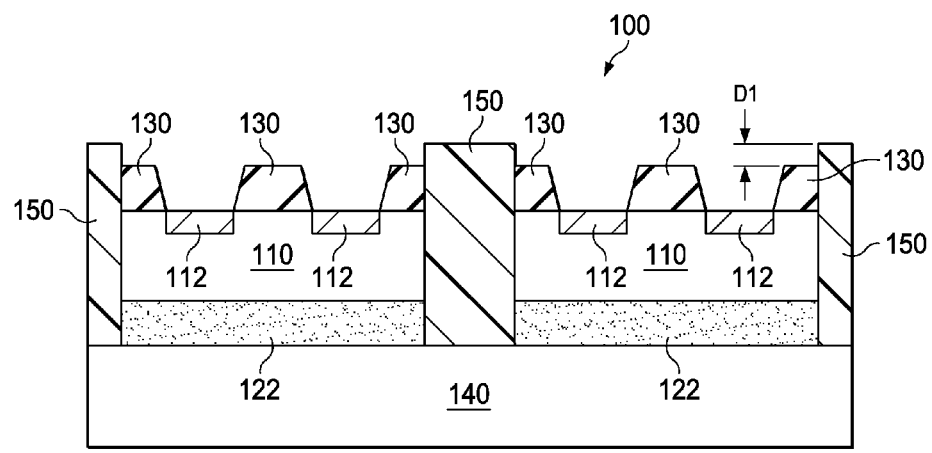
FIG. 7 is a schematic view of another embodiment of the apparatus shown in FIG. 6.

FIG. 7 is a sectional view of one example of such implementation according to one or more aspects of the present disclosure. As illustrated in FIG. 7, the upper surface of at least one of the remaining portions of the first dielectric layer 130 is recessed to a depth D1 beneath the upper surface of a nearby portion of the molding compound 150. The depth D1 may be up to about ten microns, although other depths are also within the scope of the present disclosure, and may be tuned or otherwise controlled by, for example, tuning and/or otherwise controlling the thickness of the sacrificial layer 120.

Figure 8:
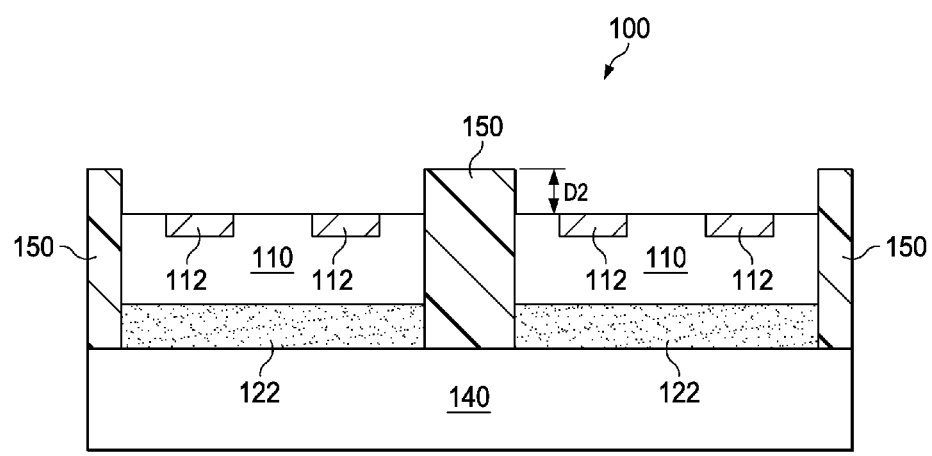
FIG. 8 is a schematic view of another embodiment of the apparatus shown in FIGS. 6 and 7.

FIG. 8 is a sectional view of a similar example depicting optional recessing of features relative to upper surfaces of the molding compound 150 according to one or more aspects of the present disclosure. The implementation depicted in FIG. 8 is lacking the first dielectric layer 130. In such embodiments, the first dielectric layer 130 may have been omitted, or it may have been substantially or entirely removed during a previous stage of manufacture.

FIG. 8 illustrates the option for the upper surface of at least one of the microelectronic devices 110 (or at least the electrical contact 112 thereof) to be recessed to a depth D2 beneath the upper surface of a nearby portion of the molding compound 150. The depth D2 may be up to about ten microns, although other depths are also within the scope of the present disclosure. As with the previous example, the depth D2 may be tuned or otherwise controlled by, for example, tuning and/or otherwise controlling the thickness of the sacrificial layer 120.

Figure 9:
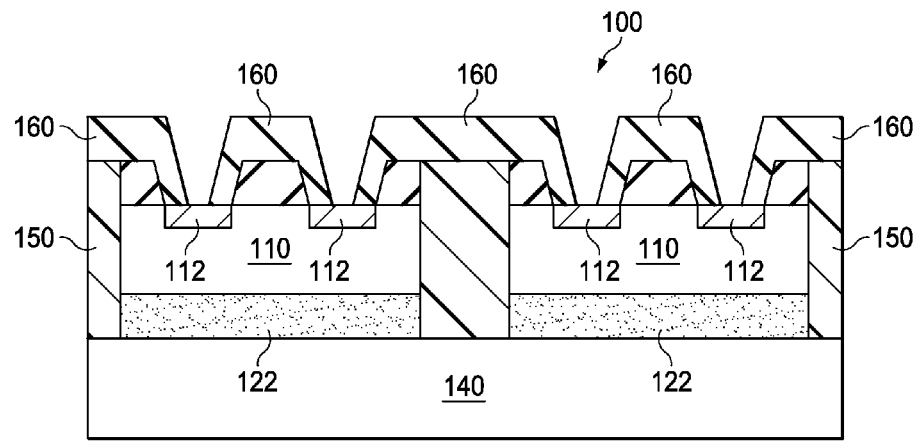
FIG. 9 is a schematic view of the apparatus shown in FIGS. 6, 7, and/or 8 in a subsequent stage of manufacture in accordance with some embodiments.

FIG. 9 is a sectional view of the apparatus 100 shown in FIG. 6 in a subsequent stage of manufacture according to one or more aspects of the present disclosure, although analogous embodiments may instead utilize the implementation shown in FIG. 7 or FIG. 8 and still remain within the scope of the present disclosure. In FIG. 9, a second dielectric layer 160 has been deposited over upper surfaces of the molding compound 150, exposed surfaces the first dielectric layer 130 (in embodiments that include the first dielectric layer 130), and upper surfaces of the microelectronic devices 110. The second dielectric layer 160 may cover portions of one or more of the electrical contacts 112 of the microelectronic devices 110. However, openings in the second dielectric layer 160 may expose at least portions of at least some of the electrical contacts 112. The second dielectric layer 160 may have a substantially smooth upper surface profile that is parallel to the substrate 140, which may be achieved via selection of thickness, materials, and/or formation processes. For example, the second dielectric layer 160 may comprise PBO and/or other dielectric materials. The second dielectric layer 160 may be deposited via CVD and/or other processes, and may subsequently be patterned by one or more photolithography processes. The thickness of the second dielectric layer 160 may range between about 5 microns and about thirty microns, although other thicknesses are also within the scope of the present disclosure.

Figure 10:
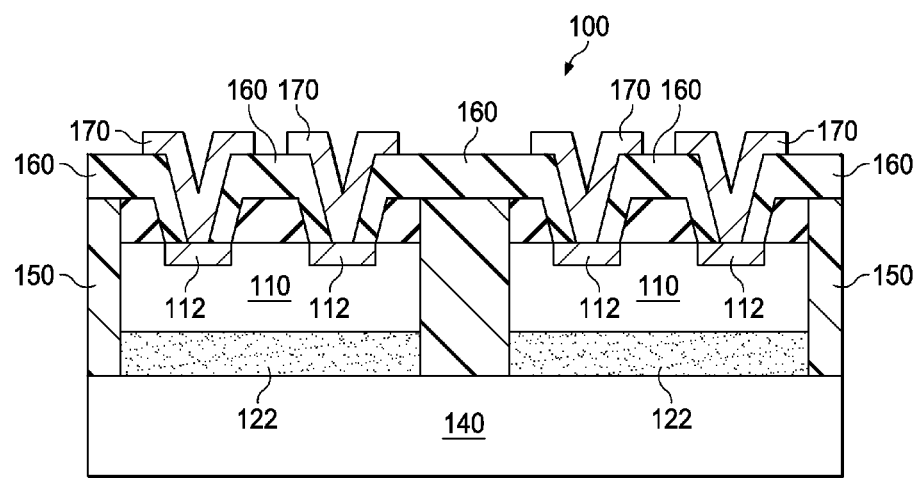
FIG. 10 is a schematic view of the apparatus shown in FIG. 9 in a subsequent stage of manufacture in accordance with some embodiments.

FIG. 10 is a sectional view of the apparatus 100 shown in FIG. 9 in a subsequent stage of manufacture according to one or more aspects of the present disclosure. In FIG. 10, a redistribution layer 170 has been formed over portions of the second dielectric layer 160. The redistribution layer 170 may extend through openings in the second dielectric layer 160 to contact at least some of the electrical contacts 112 of the microelectronic devices 110. The redistribution layer 170 may comprise copper, aluminum, doped polysilicon, and/or other materials, and may be formed via CVD, damascene, and/or other processes. The thickness of the redistribution layer 170 may range between about one micron about twenty microns, although other thicknesses are also within the scope of the present disclosure.

Although not shown in the figures, the apparatus 100 may include additional redistribution layers. One or more aspects of the present disclosure may pertain to alignment of at least the first redistribution layer 170, and perhaps others not shown in FIG. 10, relative to the electrical contacts 112 of the microelectronic devices 110. Such alignment during the current stage of manufacture may permit subsequent compensation for die shift and/or other causes of misalignment.

One or more aspects of the present disclosure may also pertain to manufacturing methods in which CMP, grinding, polishing, and/or other mechanical material removal processes may be excluded between the removal of the sacrificial layer 120 and the formation of the RDL 170. Thus, for example, there may be no such mechanical material removal processes between the manufacturing stage depicted in FIG. 6 and the manufacturing stage depicted in FIG. 10. Such implementations may lessen manufacturing costs, reduce scratching and other deformations, and/or otherwise avoid the disadvantages of many mechanical material removal processes.

Moreover, embodiments within the scope of the present disclosure may include those in which the redistribution layer 170 land on only one or two different materials. To the contrary, conventional devices may include redistribution layers that land on three or more different materials, which can encourage delamination and/or other failures. However, according to one or more aspects of the present disclosure, the only layers below and contacted by the redistribution layer 170 are the electrical contacts 112 of the microelectronic devices 110 and the second dielectric layer 160. Accordingly, delamination may be less likely for implementations within the scope of the present disclosure.

FIG. 11 is a sectional view of the apparatus 100 shown in FIG. 10 in a subsequent stage of manufacture according to one or more aspects of the present disclosure. In FIG. 11, additional redistribution layers 172 have been formed over the redistribution layer 170, and a ball-grid array (BGA) 180 has been coupled to the topmost redistribution layer 172. FIG. 11 also depicts a second layer of molding compound 152 formed above the topmost redistribution layer 172 and in the spaces between the elements of the BGA 180. The second molding compound 152 may be substantially similar in composition and/or formation relative to the molding compound 150.

FIG. 12 is a sectional view of another embodiment of the apparatus 100 shown in FIG. 11 according to one or more aspects of the present disclosure. In FIG. 12, the apparatus 100 comprises a liquid molding compound 154 above the topmost redistribution layer 172 and in the spaces between the elements of the BGA 180. In such embodiments, the apparatus 100 may still include the second molding compound 152 above the liquid molding compound 154 and in spaces between elements of the BGA 180. However, instead of the liquid molding compound 154, or in addition thereto, the apparatus 100 may comprise a silicon nitride layer, perhaps with a germanium-ion implantation to selectively relax stress, although other materials are also within the scope of the present disclosure.

FIG. 13 is a schematic view of a portion of a prior art apparatus 1400 comprising a molding compound 1410 adjacent to a microelectronics device 1420. The molding compound 1410 comprises micro-filler elements 1430 that have been damaged by CMP, grinding, and/or other mechanical material removal processes, such that boundaries of some of the micro-filler elements 1430 are substantially planar and parallel to one or more surfaces of the molding compound 1410 and/or the microelectronics device 1420. Such parallelism and/or the resulting uneven profile of the molding compound 1410 may present delamination and/or problems for device assembly and/or function.

FIG. 14 is a schematic view of a corresponding portion of the apparatus 100 shown in FIG. 11 or 12 according to one or more aspects of the present disclosure. As with the prior art apparatus 1400 depicted in FIG. 13, the molding compound 150 of the present disclosure may include micro-filler elements 190. The micro-filler elements 190 may comprise glass spheres, although other materials and geometric shapes are also within the scope of the present disclosure. However, whereas the micro-filler elements 1430 shown in FIG. 13 have been damaged, the micro-filler elements 190 shown in FIG. 14 are intact.

As described above, aspects of the present disclosure may pertain to manufacturing methods that exclude mechanical material removal processes between removal of the sacrificial layer 120 and formation of the redistribution layer 170, including during the formation of the molding compound 150. Accordingly, for embodiments in which the molding compound 150 comprises micro-filler elements 190, the micro-filler elements 190 may remain substantially whole and intact, having not been compromised by any mechanical material removal processes. As such, the micro-filler elements 190 may be maintained as substantially regularly-shaped, geometric, three-dimensional elements, and may not include any boundaries that are substantially parallel to any surfaces of the molding compound 150 and/or microelectronics device 110. At most, the boundaries of the micro-filler elements 190 disposed at any boundary of the molding compound 150 may be tangent to a surface of the molding compound 150 and/or the microelectronics device 110, but they will not be substantially parallel to any surface of the molding compound 150 and/or the microelectronics device 110.

FIG. 15 is a sectional view of at least a portion of the apparatus 100 shown in FIG. 12 incorporated in a package-on-package (PoP) type apparatus 200 according to one or more aspects of the present disclosure. In FIG. 15, the apparatus 100 shown in FIG. 12 is oriented upside down, such that the BGA 180 appears near the bottom of the apparatus 100 instead of the top. Also, in the embodiment depicted in FIG. 15, the substrate 140 includes or has been replaced by a dynamic random-access memory (DRAM) device, and is coupled to the remainder of the apparatus 100 via one or more solder balls 182 and/or other mechanical and/or electrical means. The apparatus 200 is also depicted as comprising an additional substrate 184, which may be or comprise a PCB and/or other substrate typical of PoP apparatus.

In view of all of the above, as well as the example implementations depicted in FIGS. 1-12, 14 and 15, a person having ordinary skill in the art will readily recognize that the present disclosure introduces one or more methods comprising forming a sacrificial layer over a plurality of microelectronic devices, including over an electrical contact of each microelectronic device. The microelectronic devices are coupled together by a first substrate. The microelectronic devices are then separated and coupled to a second substrate. A molding compound is then formed on the second substrate around each microelectronic device while leaving exposed an area of the sacrificial layer overlying the electrical contact of each microelectronic device.

Such methods may further comprise forming a dielectric layer over each microelectronic device before forming the sacrificial layer. Openings in the dielectric layer may expose the electrical contact of each microelectronic device. Subsequently forming the sacrificial layer may include forming the sacrificial layer on the dielectric layer and on the electrical contacts in the dielectric layer openings. Such methods may further comprise removing the sacrificial layer from over the dielectric layer before forming the molding compound, and forming the molding compound may include forming the molding compound to have a surface that is flush with a surface of the dielectric layer and a surface of the sacrificial layer. Such methods may further comprise removing the sacrificial layer from over the dielectric layer after forming the molding compound, wherein removing the sacrificial layer from over the dielectric layer may simultaneously remove the molding compound from over the dielectric layer.

Such methods may further comprise removing the sacrificial layer to expose the electrical contact of each microelectronic device, and then forming a redistribution layer contacting the electrical contact of at least one of the microelectronic devices. No material may be mechanically removed between removing the sacrificial layer and forming the redistribution layer. Removing the sacrificial layer may leave recesses between surfaces of the molding compound and surfaces of the microelectronic devices, wherein the recesses may have depths up to about ten microns. Removing the sacrificial layer may leave surfaces of the molding compound substantially flush with surfaces of the microelectronic devices.

Forming the molding compound may comprise forming the molding compound by injection molding.

The present disclosure also introduces apparatus comprising a plurality of discrete microelectronic devices spaced apart from each other, and a molding compound formed between the microelectronic devices. The molding compound comprises a plurality of micro-filler elements, and no boundary of any of the micro-filler elements is substantially parallel to a substantially planar surface of the molding compound or a substantially planar surface of any of the microelectronic devices.

The microelectronic devices may be recessed within the molding compound to a depth of up to about ten microns.

At least one side of each of the microelectronic devices may be substantially parallel with a surface of the molding compound.

Such apparatus may further comprise a ball-grid array, at least one redistribution layer, and a printed circuit board coupled to ones of the microelectronic devices via corresponding elements of the ball-grid array and the at least one redistribution layer. Such apparatus may further comprise a memory package, and the microelectronic devices may be disposed between the printed circuit board and the memory package. The memory package may comprise dynamic random-access memory.

The present disclosure also introduces one or more methods comprising forming a plurality of microelectronic devices coupled together by a first substrate, separating the microelectronic devices, and coupling the separated microelectronic devices to a second substrate. A molding compound is formed on the second substrate around each microelectronic device. The molding compound comprises a plurality of micro-filler elements, and no boundary of any of the micro-filler elements is substantially parallel to a substantially planar surface of the molding compound or a substantially planar surface of any of the microelectronic devices.

Such methods may further comprise forming a sacrificial layer over the microelectronic devices before separating the microelectronic devices, including over an electrical contact of each microelectronic device. Forming the molding compound may include leaving exposed an area of the sacrificial layer overlying the electrical contact of each microelectronic device.

Such methods may further comprise removing the sacrificial layer to expose the electrical contact of each microelectronic device, and forming a redistribution layer contacting the electrical contact of at least one of the microelectronic devices. No material may be mechanically removed between removing the sacrificial layer and forming the redistribution layer.

Forming the molding compound may comprise forming the molding compound by injection molding.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a sacrificial layer over a plurality of microelectronic devices, including over an electrical contact of each microelectronic device, wherein the microelectronic devices are coupled together by a first substrate;
   separating the plurality of microelectronic devices from each other to form separated microelectronic devices;
   coupling the separated microelectronic devices to a second substrate; and forming a molding compound on the second substrate around each microelectronic device while leaving exposed an area of the sacrificial layer overlying the electrical contact of each microelectronic device.

2. The method of claim 1 further comprising forming a dielectric layer over each microelectronic device before forming the sacrificial layer, wherein openings in the dielectric layer expose the electrical contact of each microelectronic device, and wherein subsequently forming the sacrificial layer includes forming the sacrificial layer:
   on the dielectric layer; and
   on the electrical contacts in the dielectric layer openings.

3. The method of claim 2 further comprising removing the sacrificial layer from over the dielectric layer before forming the molding compound, and wherein forming the molding compound includes forming the molding compound to have a surface that is flush with a surface of the dielectric layer and a surface of the sacrificial layer.

4. The method of claim 2 further comprising removing the sacrificial layer from over the dielectric layer after forming the molding compound, and wherein removing the sacrificial layer from over the dielectric layer simultaneously removes the molding compound from over the dielectric layer.

5. The method of claim 1 wherein forming the molding compound comprises forming the molding compound by injection molding.

6. The method of claim 1 further comprising:
   removing the sacrificial layer to expose the electrical contact of each microelectronic device; and
   forming a redistribution layer contacting the electrical contact of at least one of the microelectronic devices.

7. The method of claim 6 wherein no material is mechanically removed between removing the sacrificial layer and forming the redistribution layer.

8. The method of claim 6 wherein removing the sacrificial layer leaves recesses between surfaces of the molding compound and surfaces of the microelectronic devices, wherein the recesses have depths up to about ten microns.

9. The method of claim 6 wherein removing the sacrificial layer leaves surfaces of the molding compound substantially flush with surfaces of the microelectronic devices.

10. A method, comprising:
   forming a plurality of microelectronic devices coupled together by a first substrate;
   separating the plurality of microelectronic devices from each other to form separated microelectronic devices;
   coupling the separated microelectronic devices to a second substrate; and
   forming a molding compound on the second substrate around each microelectronic device, wherein the molding compound comprises a plurality of micro-filler elements, and wherein no boundary of any of the micro-filler elements is substantially parallel to a substantially planar surface of the molding compound or a substantially planar surface of any of the microelectronic devices.

11. The method of claim 10 further comprising forming a sacrificial layer over the microelectronic devices before separating the microelectronic devices, including over an electrical contact of each microelectronic device, and wherein forming the molding compound includes leaving exposed an area of the sacrificial layer overlying the electrical contact of each microelectronic device.

12. The method of claim 11 further comprising:
   removing the sacrificial layer to expose the electrical contact of each microelectronic device; and
   forming a redistribution layer contacting the electrical contact of at least one of the microelectronic devices.

13. The method of claim 12 wherein no material is mechanically removed between removing the sacrificial layer and forming the redistribution layer.

14. The method of claim 10 wherein forming the molding compound comprises forming the molding compound by injection molding.

15. The method of claim 1 wherein the step of separating the plurality of microelectronic devices from each other comprises physically separating portions of the first substrate from one another.

16. A method, comprising:
   forming a sacrificial layer over a plurality of microelectronic devices, including over an electrical contact of each microelectronic device, wherein the microelectronic devices are coupled together by a first substrate;
   separating the plurality of microelectronic devices from each other to form separated microelectronic devices by physically singulating the first substrate;
   coupling the separated microelectronic devices to a second substrate; and
   forming a molding compound on the second substrate around each microelectronic device while leaving exposed an area of the sacrificial layer overlying the electrical contact of each microelectronic device; and
   removing the sacrificial layer.

17. The method of claim 16 wherein physically singulating the first substrate includes a process selected from the group consisting of grinding, dicing, laser cutting, and sawing.

18. The method of claim 16 wherein the molding compound is formed around respective sidewalls of the plurality of microelectronic devices after the microelectronic devices are separated from one another.

19. The method of claim 16 further comprising removing the sacrificial layer from over a dielectric layer before forming the molding compound, and wherein forming the molding compound includes forming the molding compound to have a surface that is flush with a surface of the dielectric layer and a surface of the sacrificial layer.

20. The method of claim 16 further comprising removing the sacrificial layer from over a dielectric layer after forming the molding compound, and wherein removing the sacrificial layer from over the dielectric layer simultaneously removes the molding compound from over the dielectric layer.

* * * * *